United States Patent
Monestier et al.

(10) Patent No.: US 11,380,730 B2
(45) Date of Patent: Jul. 5, 2022

(54) PASSIVE MATRIX SINGLE-COLOURED LED DISPLAY ASSEMBLY (71) Applicant: LUMILEDS HOLDING B.V., Schiphol (NL)

(72) Inventors: Florent Monestier, Kerkrade (NL); Casey Israel, Brüggen (DE)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 16/294,446

(22) Filed: Mar. 6, 2019

(65) Prior Publication Data
US 2019/0279558 A1 Sep. 12, 2019

(30) Foreign Application Priority Data

Mar. 9, 2018 (EP) .................................... 18160868

(51) Int. Cl.
*H01L 27/15* (2006.01)
*G09G 3/32* (2016.01)
*H01L 33/62* (2010.01)
*H01L 27/146* (2006.01)
*B60K 35/00* (2006.01)
(Continued)

(52) U.S. Cl.
CPC ............ *H01L 27/156* (2013.01); *B60K 35/00* (2013.01); *B60R 1/00* (2013.01); *G09G 3/00* (2013.01); *G09G 3/32* (2013.01); *H01L 33/62* (2013.01); *B60Q 1/268* (2013.01); *B60Q 1/2696* (2013.01); *B60Q 1/50* (2013.01); *B60R 2300/20* (2013.01); *G09G 2300/0426* (2013.01); *G09G 2300/06* (2013.01); *G09G 2380/02* (2013.01);
(Continued)

(58) Field of Classification Search
CPC ...... H01L 27/3281–329; H01L 27/156; G09G 2300/0404–0417; G09G 2300/06; G09G 3/3216; G09G 3/32; G09G 3/00
See application file for complete search history.

(56) References Cited

U.S. PATENT DOCUMENTS 5,893,721 A * 4/1999 Huang ................. H01L 27/3276 438/23
2015/0371585 A1 * 12/2015 Bower .................. H01L 33/502 345/1.1
(Continued)

FOREIGN PATENT DOCUMENTS

CA 920199 A 1/1973

OTHER PUBLICATIONS

International Preliminary Report on Patentability Chapter 1 dated Sep. 15, 2020 for PCT International Application No. PCT/EP2019/055119.
(Continued)

*Primary Examiner* — Laura M Menz
*Assistant Examiner* — Candice Chan
(74) *Attorney, Agent, or Firm* — Volpe Koenig (57) ABSTRACT The invention describes a passive matrix single-color LED display assembly comprising a matrix of row conductor lines and column conductor lines; an array of direct-emitting LED packages, wherein the anode of each LED package is electrically connected to one of the row conductor lines and the cathode of that LED package is connected to one of the column conductor lines; and a driver configured to apply a bias voltage to a row conductor line and to apply a bias voltage to a column conductor line according to an image to be displayed.

11 Claims, 5 Drawing Sheets

(51) Int. Cl.
    *B60R 1/00*          (2022.01)
    *G09G 3/00*          (2006.01)
    *B60Q 1/26*          (2006.01)
    *B60Q 1/50*          (2006.01)

(52) U.S. Cl.
    CPC .... *G09G 2380/10* (2013.01); *H01L 27/14636* (2013.01); *H01L 2933/0066* (2013.01)

(56) References Cited

U.S. PATENT DOCUMENTS

| | | | |
|---|---|---|---|
| 2016/0105950 A1* | 4/2016 | Drzaic | H05K 1/0296 |
| | | | 174/251 |
| 2017/0009971 A1* | 1/2017 | Chan | H01L 25/0753 |
| 2017/0210285 A1* | 7/2017 | Kobayashi | B60Q 1/50 |
| 2018/0033853 A1* | 2/2018 | Bower | H01L 27/156 |

OTHER PUBLICATIONS

International Search Report dated May 22, 2019 for PCT International Application No. PCT/EP2019/055119.
European Search Report dated May 18, 2020 for European Application No. 18160868.

\* cited by examiner

PASSIVE MATRIX SINGLE-COLOURED LED DISPLAY ASSEMBLY

FIELD OF INVENTION

The invention describes a passive matrix LED display assembly; an automotive vehicle; and a method of manufacturing a passive matrix LED display.

BACKGROUND

A new development in the field of automotive mobility is to improve or enhance communication between a vehicle and its environment, for example to present information to a pedestrian or to another vehicle. An enhanced message may be presented to a pedestrian or to the drivers of other vehicles, informing them about the intentions of the vehicle or simply about the current status of the vehicle. The message being presented may relate to imminent movement of the vehicle (from a parked state), to an imminent turning action, to the battery charge status of an electric vehicle, etc. The ability to present such information may assist in reducing misunderstanding, for example between pedestrian and autonomous vehicles, and may contribute to an increase in safety.

A simple way to communicate a message to the driver behind or to a pedestrian is to display an image in a display module mounted for example on the rear of the vehicle. Generally, electronic display modules are designed to achieve a high response time and high contrast in order to deliver good quality images. However, in a conventional liquid crystal display (LCD) up to 75% of the light emitted by the back source can be absorbed by the liquid crystal filter itself, so that the overall efficiency of such a display is very low and its power consumption is disproportionately high. This is a disadvantage particularly in the case of electric vehicles, since any such auxiliary device will consume precious battery power. Moreover, liquid crystal filters are costly to manufacture, resulting in relatively expensive display modules. As an alternative, an OLED (organic light-emitting diode) display might be used. However, the brightness of an OLED panel is still relatively low, so that the image information may remain unseen, particular in poor weather conditions or when the viewer is not close enough to the display.

A display using LEDs (light-emitting diodes) may be preferred, since an LED display is significantly brighter than an OLED display of similar size and consumes less energy than an LCD display of similar size. However, a drawback of conventional LED active matrix displays is that each pixel must be controlled individually and requires a transistor and a capacitor to maintain its pixel state. A conventional LED display as used in a monitor or television screen is usually made of many thousands of miniscule chip-scale packaged (CSP) or wafer-level packaged (WLP) LED units, since a high resolution and therefore very small pixel size is desirable, and a chip-scale packaged LED unit is only slightly larger than the LED die itself, which is usually a surface mountable die. Such very small components require dedicated equipment for placing and soldering the LED units onto conductive tracks of a rigid supporting PCB (printed circuit board). The manufacturing complexity of this kind of display is therefore relatively high.

Therefore, it is an object of the invention to provide a more economical way of equipping a vehicle to present image information.

SUMMARY

The object of the invention is achieved by the passive matrix LED display assembly of claim 1; by the automotive vehicle of claim 10; and by the method of claim 11 of manufacturing a passive matrix LED display.

According to the invention, the passive matrix LED display assembly comprises a free-floating matrix of n row conductor lines and m column conductor lines and an n×m array of direct-emitting LED packages arranged over the row/column intersections. An LED package comprises a single LED mounted on an interposer. The anode of each LED package is electrically connected to one of the row conductor lines and the cathode of that LED package is connected to one of the column conductor lines. A driver is configured to apply a first bias voltage to each row conductor line and to apply a second bias voltage to each column conductor line. The driver applies the bias voltages to pairs of row/column lines according to an image to be generated by the LED display.

In the context of the invention, the conductor lines need not be mounted on or attached to any carrier or support, but can be effectively "free-floating", and the resulting matrix is therefore also "free-floating".

Preferably, the LED is provided as a chip-scale packaged LED die (or similar) that can be mounted on the interposer, which is preferably significantly larger than the LED die. The area of an interposer (and therefore the area of the corresponding LED package) is preferably at least 16 mm$^2$, more preferably at least 25 mm$^2$, whereas the area of a chip-scale packaged LED (viewed from above), being only slightly larger than the emission area of the LED die, can be in the order of only 0.5 mm$^2$ or less. Therefore, in the inventive display, the size of the interposer effectively determines the minimum pixel size. Unlike conventional LED displays that strive to obtain a smallest-possible pixel size and fine resolution, a coarse resolution is regarded as an advantage in the context of the invention.

An advantage of the inventive matrix LED display assembly is that it is "passive", in other words each LED is turned on or turned off by applying appropriate bias voltages to the corresponding pair of conductor lines and, in contrast to the prior art active matrix LED displays, no measures need be taken to maintain a pixel state while other pixels are being addressed. The resolution of the passive matrix LED display assembly need not be particularly fine, in fact a relatively coarse resolution can be acceptable or even desirable for many applications. The ability to use readily available and cheap LED packages as the individual "pixels" of the display means that the display can be manufactured at low cost. It is also possible to repair a defective LED pixel with relatively little effort.

The invention is based on the insight that what are generally perceived as drawbacks of a passive matrix display—i.e. its slow response time, imprecise voltage control and low contrast—may not necessarily be problematic. In an automotive display application as described above, simple single-color pictograms can be shown at low refresh rate, low contrast, low resolution, etc. The main requirement of image size and image brightness can easily be met by using direct-emitting LEDs, since mid-power LEDs are sufficiently bright, cheap and readily available.

According to the invention, the automotive vehicle comprises a number of such passive matrix LED display assemblies, arranged to be visible from the outside of the vehicle; a memory configured to store image data for a number of images; and a controller configured to retrieve image data for a specific image and to control the driver of the passive matrix LED display assembly to display that image.

An automotive vehicle can therefore easily be equipped with informative displays at any appropriate position, for example in a rear or side window, on the vehicle roof or other outer surface, and the display(s) can be used to impart important information to passers-by or other traffic participants. For vehicle-to-pedestrian communication, high technical display specifications are not required, and it can suffice to show only simple patterns like single-color pictograms. The invention is based on the insight that a passive matrix design may be sufficient for this type of application, since image resolution does not need to be high and response time does not need to be particularly fast.

According to the invention, the method of manufacturing a passive matrix LED display comprises the steps of providing a matrix of n row conductor lines and m column conductor lines; providing an n×m array of direct-emitting LED packages and electrically connecting the anode of each LED package to one of the row conductor lines and electrically connecting the cathode of that LED package to one of the column conductor lines; and providing a driver configured to apply a bias voltage to a row conductor line and to apply a bias voltage to a column conductor line according to an image to be displayed.

An advantage of the inventive method is that the passive matrix LED display assembly can be manufactured at favourably low cost, since the display can be put together from relatively cheap materials, and using readily available and cheap LED packages as the individual display "pixels". Since each LED package can be soldered to its pair of conductor lines, it is conceivable that a defective LED pixel can be replaced with relatively little effort.

The dependent claims and the following description disclose particularly advantageous embodiments and features of the invention. Features of the embodiments may be combined as appropriate. Features described in the context of one claim category can apply equally to another claim category.

As explained above, an LED package comprises a CSP LED mounted on the interposer. The interposer can be a piece of PCB, a ceramic substrate, etc. The desired large pixel size means that the interposers can also be large, which is an advantage since a large interposer improves heat transfer from the hot LED during operation. Another advantage of a large interposer is that it greatly facilitates mechanical handling of the LED package. An interposer can be prepared with vias to solder contacts on its underside to also facilitate electrical connection of the LED anode and cathode to the conductor lines in the row/column matrix. Preferably, for ease of assembly, the LED packages used are bottom-contact packages, so that the anode and cathode contacts can be soldered relatively easily to the matrix of conductor lines. Alternatively, the anode and cathode contacts can be secured to the conductor lines using conductive glue or any other suitable means.

The type of image to be displayed by the inventive passive matrix display is preferably a relatively simple image. For example, the driver can be configured to drive the LED packages to display a pictogram. A controller may retrieve image data for a specific pictogram. Image data may comprise a pattern defining which pixels are "on" and which are "off" for the intended pictogram. The controller can convert this information into appropriate driver control commands so that the driver applies bias voltages to the appropriate conductor line pairs.

An advantage of the invention is that only the terminals at the ends of the row and column conductor lines need be connected to an individual driver channel. For example, if a display comprises a 30×30 matrix of LEDs, it is not necessary to connect the 900 LEDs (30×30) to 900 driver channels. Instead, only 60 connections (30+30) will be needed. This configuration considerably simplifies the manufacturing process compared to the more complex and expensive type of display in which each LED must be directly connected to the driver.

The drive control of a passive matrix display is relatively simple. A bias voltage is applied as appropriate to a particular row and a particular column to turn on a specific LED (i.e. image pixel) situated at the intersection of that row and column. To obtain an image, the image pixels are excited sequentially, i.e. one at a time. To generate an image, the switching frequency of a pixel should be significantly higher than eye sensitivity, for example at least 100 Hz.

When an image is generated in the inventive display assembly, a viewer will perceive the image to have a nominal brightness. However, since a pixel is effectively off most of the time in which the image is generated, the brightness of each pixel should be significantly brighter than nominal display brightness. For example, the peak brightness of a pixel in a 30×30 display should be approximately 30 times greater than the nominal display brightness during the few tens of microseconds in which the pixel is turned on. A 30×30 display may have a nominal brightness of approximately 5 kCd/m$^2$, so that the peak brightness of each pixel should be about 150 kCd/m$^2$ when turned on. A mid-power LED can easily deliver this peak brightness level, so that the inventive display assembly can be realised using relatively cheap mid-power LEDs.

As explained above, an LED can be operated in a power-efficient manner by rapidly switching it on and off, so that it is perceived as "on" by a viewer. The same principle can be used to regulate the perceived brightness of an LED. In a preferred embodiment of the invention, therefore, the driver is realised to apply pulse-width modulation to adjust the brightness of an LED package. In this way, interesting effects can be achieved with relatively little effort, and an image (or a portion of an image) can be "animated" to some extent by pulsing its brightness, for example.

The smoothness of an image shown in the display could be increased by making the matrix relatively dense and packing very small LEDs very close together. However, this would increase the cost of the inventive passive matrix display. Therefore, in a preferred embodiment of the invention, the image quality is improved by means of a suitable light-guide arrangement. For example, each LED package could be enclosed in a light-guide element to spread the light from that LED package, thereby making the LED packages appear less like isolated rectangles of light when turned on.

In a particularly preferred embodiment of the invention, the passive matrix LED display comprises a pixel cavity frame arranged over the array of LED packages, which cavity frame is realised to comprise a matrix of cavities, and wherein each cavity is shaped to surround an LED package. The pixel cavity frame can be placed over the LED package matrix and can be secured to the matrix of conductor lines. Preferably, the material of the pixel cavity frame is elastic or flexible, so that the entire assembly can be bent into shape or can comply with the shape of a curved surface to which the LED display will be attached. An advantage of this construction is that it provides favourably large pixels which are characterized by a uniform light distribution and high brightness within each pixel. This is achieved by defining relatively large pixel cavities in the cavity frame and filling these cavities with a suitable light guide material. When viewed from a distance of several metres or even several tens of metres (typical for vehicle-to-pedestrian or vehicle-to-vehicle communication) the large pixels ensure that the image information is easily seen by the viewer. An advantage of the inventive method is that display pixel size can easily be "tuned" simply by adjusting the spaces between conductor lines and by adjusting the pixel cavity frame size.

The side walls of the pixel cavity frame, i.e. the inside surfaces each cavity, can be highly reflective. The cavity side walls may be made of (or coated with) a specular or diffuse material. In a further preferred embodiment of the invention, the cavities of the cavity frame are filled with a light-guide material such as silicone. This can be done as a final manufacturing step, using any suitable moulding process such as injection moulding, transfer moulding, extrusion moulding, etc., as will be known to the skilled person. The light-guide material can serve the purpose of maximising the light output of the LEDs while also serving to attach the pixel cavity frame to the LED matrix. Preferably, the light-guide material is also elastic or flexible. In an embodiment in which the side walls of the pixel cavity frame are highly reflecting, it may be sufficient to arrange a diffusor at the upper level of the cavity frame, and to leave the cavities air-filled instead of filling them with a light guide material.

The conductor lines can be made of any suitable material. In a preferred embodiment of the invention, a conductor line comprises a strip of conductive material, for example a narrow metal strip. In a preferred embodiment of the invention, the row conductor lines and/or the column conductor lines are stamped from a flat metal sheet. Alternatively, the conductor lines can be made of wires of an appropriate cross-sectional thickness and shape. Preferably, the thickness and width of the conductor lines and/or the material of the conductor lines are chosen such that a conductor line is flexible within the overall matrix. For example, the conductor lines may have a thickness of 0.2 mm-1.0 mm and a width of approximately 2.5 mm.

The cross-section of a conductor line is preferably at least 0.07 mm$^2$. For example, a conductor line with a width of 1.3 mm may be stamped from a metal sheet with a thickness of 0.233 mm. Alternatively, a conductor line may be provided in the form of a wire with a diameter of approximately 300 μm. With such a cross-sectional area, a conductor line can transport LED current without any significant voltage drop. The relatively large cross-section will be effective in preventing damage during manipulation or handling of the display during production, installation, etc. Because the matrix of conductor lines is flexible, the inventive passive matrix single-color LED display assembly may be manufactured initially as a "flat" product which can then be bent or curved to suit its intended application. For example, an intended application may foresee a curved optical element, and the display assembly can be gently bent until its shape matches that of the optical element. Similarly, it may be desired to mount the inventive single-color LED display assembly onto a curved part such as a heatsink, and this is easily achieved by gently bending the display assembly until it has been brought into the desired shape.

Adjacent conductor lines may be separated by a suitable gap, depending on the physical dimensions of the LED package that will be used. For example, a gap of 3.0 mm between adjacent conductor lines may be sufficient to achieve the desired pixel size.

In a particularly preferred embodiment of the invention, a conductor line comprises a number of spring elements, wherein a spring element is arranged between neighbouring intersections of row and column conductor lines. Preferably, all conductor lines are shaped so that there is a spring element between any two adjacent row/column intersections. A spring element can arise from choosing a suitable shape for a conductor line, for example to include a U-shape, C-shape, or S-shape portion. For example, such patterned conductor lines can be stamped from a metal sheet using a suitable tool. Preferably, the spring elements are formed in the plane of the conductor matrix or to extend outward from the below the matrix (the LEDs and cavity frame being arranged "above" the conductor matrix). An advantage of these patterned conductor lines is that the conductor matrix (and therefore the entire display assembly) can easily adapt to fit against any mounting surface. Generally, most candidate surfaces of a vehicle (rear window, side panel, rear fender etc.) are curved in several planes, and the inherent deformability of this realisation of the inventive display assembly means that it can simply conform to the shape of the intended mounting surface. In contrast, prior art LCD panels are generally flat and cannot lie directly against such a curved surface. A further advantage of these patterned conductor lines is that the conductor matrix can maintain its shape even if the LEDs get very hot, since the spring elements may expand in such a way that the distances between intersections remain essentially the same.

The bias voltage applied to a row conductor line should only reach the anode(s) of the targeted LED package(s). Similarly, the bias voltage applied to a column conductor line should only reach the cathode(s) of the targeted LED package(s). Therefore, in a preferred embodiment of the invention, a layer of electrically insulating material is applied onto a surface of a conductor line to electrically isolate that conductor line from any orthogonal conductor lines with which it intersects. For example, if the n row conductor lines are laid onto the m column conductor lines, a layer of electrically insulating material can be applied onto the underside of each row conductor line to electrically isolate them from the column conductor lines. Of course, it would be equally possible to apply a layer of electrically insulating material onto the top side of each column conductor line to electrically isolate these from the row conductor lines. A suitable insulating material can be a polyimide, for example, which can be printed or sprayed onto the appropriate surfaces and allowed to cure. Alternatively, a thin deformable sheet of insulating material such as polyimide, with a thickness of 20 μm-300 μm, may be arranged between the row conductor lines and the column conductor lines. During assembly, the deformable sheet is laid on the first set of parallel conductor lines to cover at least the intersection region, preferably the entire area. The thin sheet preferably has small openings at locations corresponding to the future positions of LED package solder pads (either the anodes or the cathodes). Alternatively, such openings can be patterned by laser cutting, laser ablation, etc. after which the grid of column conductors will be put into place on top of the thin sheet of insulant. The LED packages can then be soldered to the conductor line matrix, for example by depositing solder paste at appropriate locations on the upper set of conductor lines and also—through the openings in the insulating sheet—on the lower set of conductor lines.

Preferably, the conductor lines are shaped to overlap at row/column intersections such that the thickness of an intersection does not exceed the thickness of the thickest conductor line. For example, in a particularly preferred embodiment of the invention, a column conductor line is shaped to provide a plurality of recesses to accommodate the plurality of row conductor lines. If the n row conductor lines are stamped from a flat metal sheet as explained above, each column conductor line can comprise n recesses, each with a depth that corresponds to the depth of a row conductor line. The depth of a recess preferably also takes into account the thickness of the insulating material applied to the underside of the row conductor lines. Electrical insulation between a row conductor line and a column conductor line may be improved by leaving a sufficiently large gap between the edges of a recess and the edges of the conductor line resting in that recess. To further improve the electrical isolation between the row/column conductor lines, it is preferable to also apply insulant material to the side faces of a recess and/or to the relevant side faces of the conductor line arranged in that recess.

The inventive passive matrix LED display can be used as an advanced communication means between a vehicle such as a car and the surrounding environment. For example, an instance of the inventive passive matrix LED display can be used as an informative indicator element to deliver an enhanced message to a pedestrian or to the driver of another car. The "message" may inform the viewer of the intentions of the car or driver, of the current status of the car, etc. Depending on the kind of display and on its position on the vehicle, different kinds of information could be displayed, for example to inform pedestrians or other vehicles that the car will shortly start moving; that the car is slowing down to stop; that the car will start moving into a turn, etc. Such communication can help to reduce misunderstanding between pedestrians and autonomous cars and can improve safety. Such displays may be expected to be very useful in autonomous vehicles in the future, since it will be important for an autonomous vehicle to inform its environment of intended actions. An electric car may use a display during a charging procedure to show the battery charge status, so that another user can decide whether or not to wait for the charging facility, for example.

In a preferred embodiment of the invention, the vehicle can incorporate one or more instances of the inventive passive matrix LED display. In practice, the easiest way to communicate a message to a person behind a vehicle is to display the message where it can be seen well, for example at the rear of the vehicle and/or on a side. The displayed message should be clear and understandable by everybody. For this reason, the message is preferably shown in the form of a pictogram and/or one or more universally understood words.

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWINGS

In the drawings, like numbers refer to like objects throughout. Objects in the diagrams are not necessarily drawn to scale.

DETAILED DESCRIPTION OF THE PREFERRED EMBODIMENTS

Figure 1:
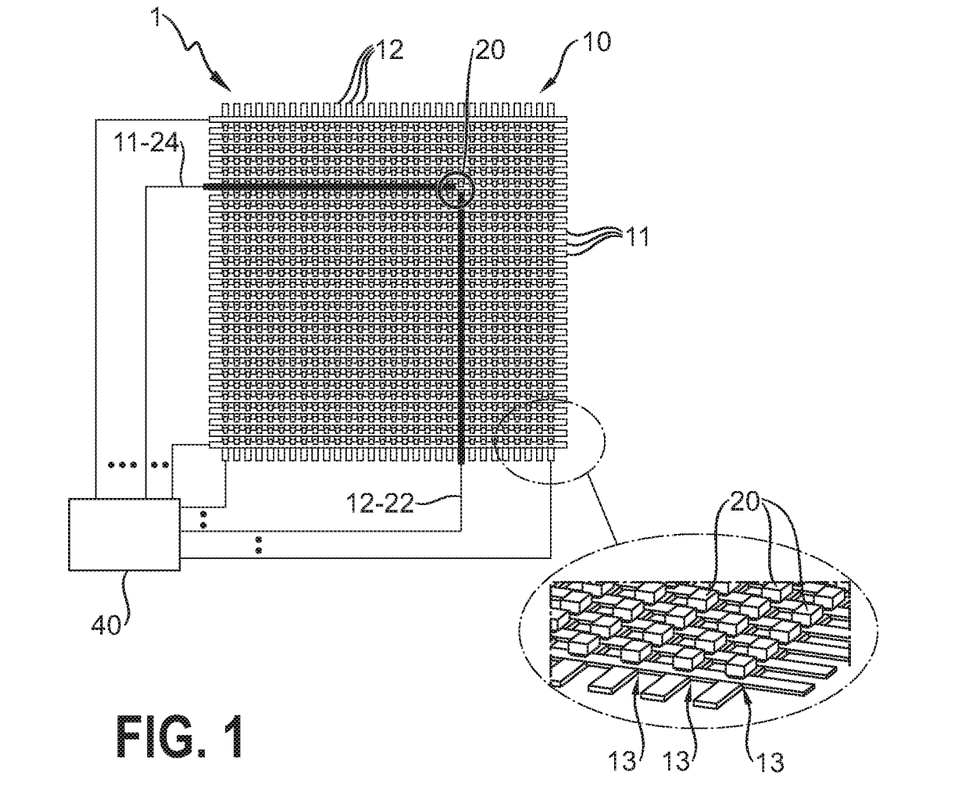
FIG. 1 shows a partially assembled embodiment of the inventive passive matrix LED display.

FIG. 1 shows a possible realization of the inventive passive matrix LED display assembly 1 in a partially assembled state. The diagram shows a matrix 10 of thirty row conductor lines 11 and thirty column conductor lines 12. The enlarged portion shows a perspective view onto a corner of the passive matrix LED display assembly 1, and shows a number of direct-emitting LED packages 20 in place on the conductor matrix 10. The anode 21 of each LED package 20 is electrically connected to one of the row conductor lines 11, and the cathode 22 of that LED package 20 is connected to one of the column conductor lines 12. The enlarged portion of the drawing shows several LED packages 20 in place over row/column intersections 13 (for clarity, only the relatively large interposers 24 are shown). The drawing indicates a driver 40 that is configured to apply a first bias voltage to each row conductor line 11 and to apply a second bias voltage to each column conductor line 12. The drawing indicates an LED package 20 (circled) at the junction of the 24th row conductor and 22nd column conductor that will light up when bias voltages are applied to the relevant row conductor line 11_24 and the relevant column conductor line 12_22. In this exemplary embodiment, the driver 40 can apply up to thirty separate first bias voltages to the row conductors 11 over thirty individual connections; similarly the driver 40 can apply up to thirty separate second bias voltages to the column conductors 12 over thirty individual connections. Suitable connectors such as ribbon connectors may be used to connect the conductor matrix 10 to the driver 40.

Figure 2:
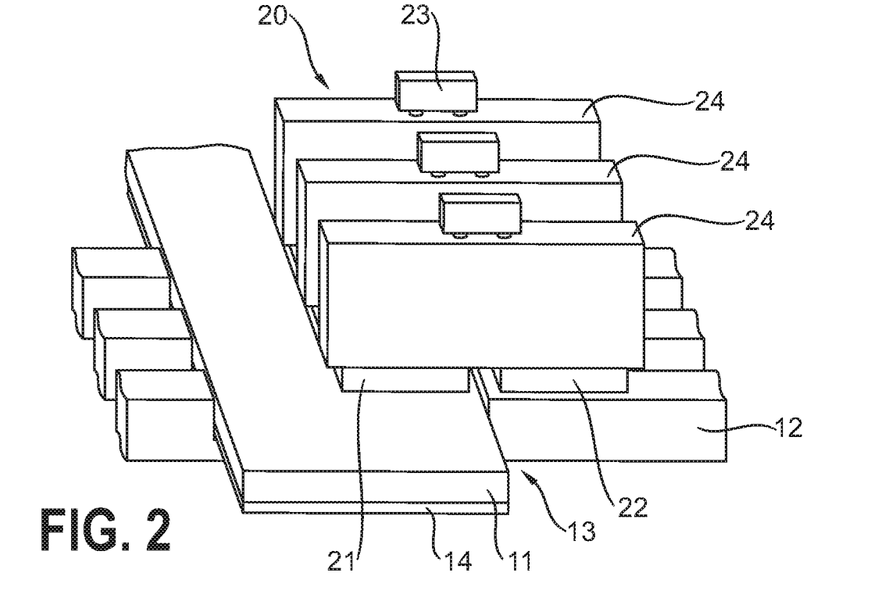
FIG. 2 shows a number of LED packages in place in an embodiment of the inventive passive matrix LED display.

FIG. 2 shows a closer view of a number of LED packages 20 (each comprising an LED 23 mounted on an interposer 24) in place over row/column intersections 13 of the matrix 10. The anode and cathode contacts 21, 22 of an LED package 20—shown here in a very simplified manner—may be soldered to the row and column conductor lines, for example, or secured by means of an electrically conductive adhesive. The diagram also shows that a row conductor line 11 is electrically isolated from a column conductor line 12 by a layer of insulation 14 which can have been laminated into place. The insulation layer may have a thickness of about 0.1 mm, for example.

Figure 3:
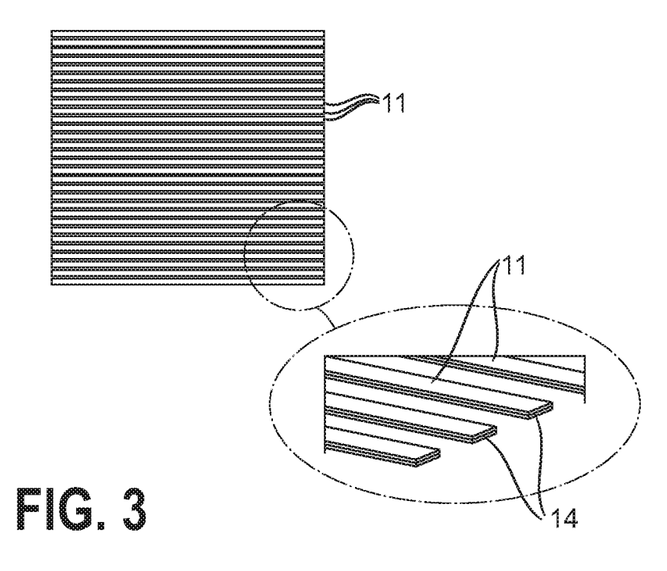
FIG. 3 shows a set of row conductor lines.

FIG. 3 shows a set of row conductor lines 11. The enlarged portion shows the layer of insulating material applied to the base of each row conductor line 11. The row conductor lines 11 may by stamped from a flat metal sheet, and the layer of insulating material can be applied before or after the stamping procedure.

To simplify handling of the conductor lines during the manufacturing process, some suitable material may be used between conductor lines to keep them attached until the matrix is assembled. For example thin bridges to connect adjacent conductor lines may be stamped. In this way, a set of conductor lines can be handled as a single part. When the matrix is assembled and the LEDs effectively hold the "free-floating" conductor lines together, the bridges between conductor lines can be cut in a laser process or using any suitable cutting tool.

Figure 4:
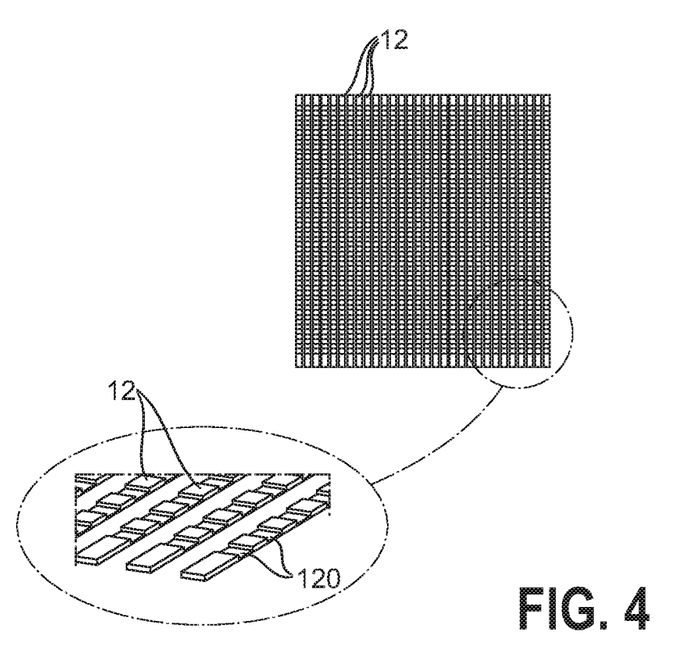
FIG. 4 shows a set of column conductor lines.

FIG. 4 shows a set of column conductor lines 12. To achieve a favourably flat matrix construction, the column conductor lines 12 are shaped to receive the row conductor lines 11. To this end, the column conductor lines 12 are formed to have appropriately shaped recesses 120, as can be seen in the enlarged portion of the drawing. In this case also, the column conductor lines 12 may by stamped from a flat metal sheet. The matrix of conductor lines may be protected by over-moulding a suitable insulating material such as plastic around the conductor lines. This would prevent a short circuit between conductor lines, for example when handling the display.

Figure 5:
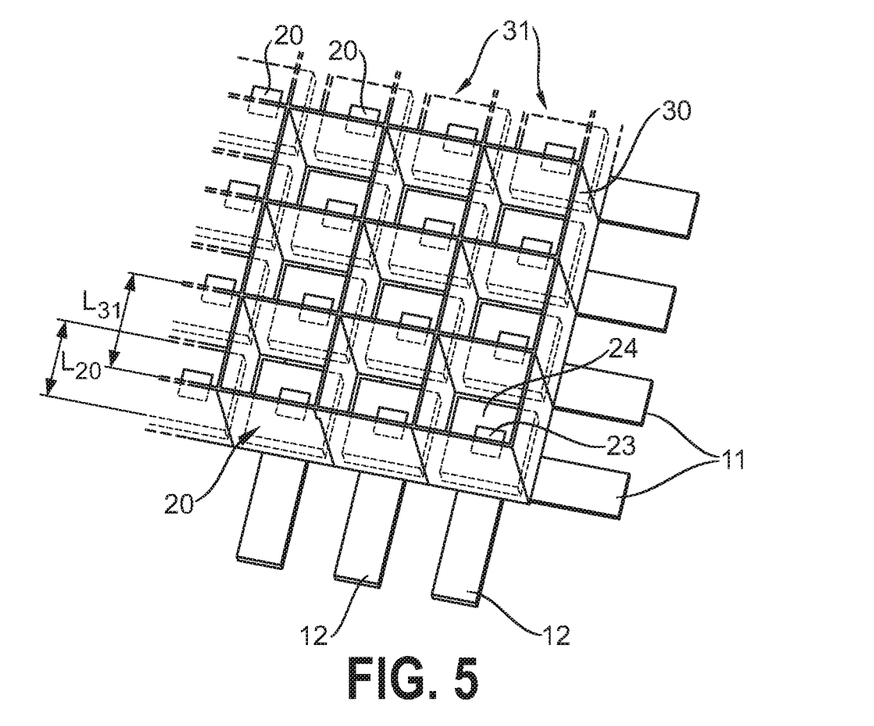
FIGS. 5 and 6 show further stages in the manufacture of an embodiment of the inventive passive matrix LED display assembly.

FIG. 5 shows a further stage in the manufacture of the inventive passive matrix LED display assembly. Here, a cavity frame 30 has been put into place over the array of LED packages 20. The cavity frame 30 may be made of a flexible material such as a suitable plastic so that it can bend to a desired extent. The cavity frame 30 comprises a plurality of cavities 31, each of which encloses or surrounds an LED package 20 on all four vertical sides. Preferably, the material is opaque so that it can prevent cross-talk between the pixels when an image is being displayed. In this exemplary embodiment, the cavities have a square shape, but it shall be understood that the frame can be constructed to have cavities of any shape. The side length $L_{20}$ of a square LED package 20—i.e. the side length $L_{20}$ of the interposer 24—may be about 5.0 mm, and the side length $L_{31}$ of a corresponding square pixel cavity 31 may be slightly larger, e.g. 6.0 mm. The height of the pixel cavity frame 30 is preferably about twice the pixel cavity width $L_{31}$. Although not shown in the diagram, a heat sink may be arranged to transfer heat from the LEDs during operation. For example, a heat sink may be shaped to make contact with an exposed area on the underside of the interposers when the heat sink is arranged underneath the matrix of conductor lines 11, 12.

Figure 6:
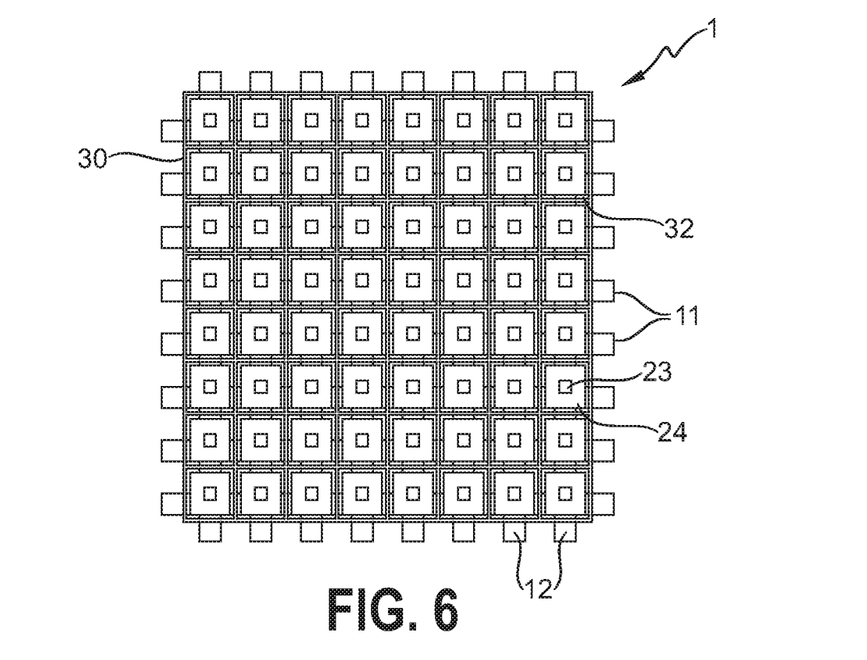

FIG. 6 shows a further stage in manufacture. Here, the cavities 31 have been filled or over-moulded with a light-guide material such as silicone which is transparent, remains stable over time and is easy to mould. The light-guide material may comprise scattering particles. To fill the cavities, the entire assembly including anode and cathode conductor lines, LED packages, solder contacts and pixel cavity frame defining the pixel area will be placed into a moulding tool which is then filled with a light-guide material that is allowed to cure. The diagram shows an 8×7 array, but of course other array sizes are possible. For example, the display may comprise 500 to 1,500 LED packages arranged in an array.

Overmoulding of the light guide material serves to distribute the light uniformly inside a pixel cavity. Preferably, the light guide material does not completely fill the pixel cavity so that light from one LED cannot pass to the cavity of an adjacent pixel. The overmoulding step is carried out in such a way to ensure that it does not cover the ends of the conductor lines. The pixel cavities can also be capped with a suitable optical layer, for example a plastic material with volume-scattering properties to achieve uniform light distribution inside the pixel cavities. Such a capping layer could be integrated as part of the vehicle exterior, for example if the vehicle exterior is realised as a translucent "skin".

Figure 7:
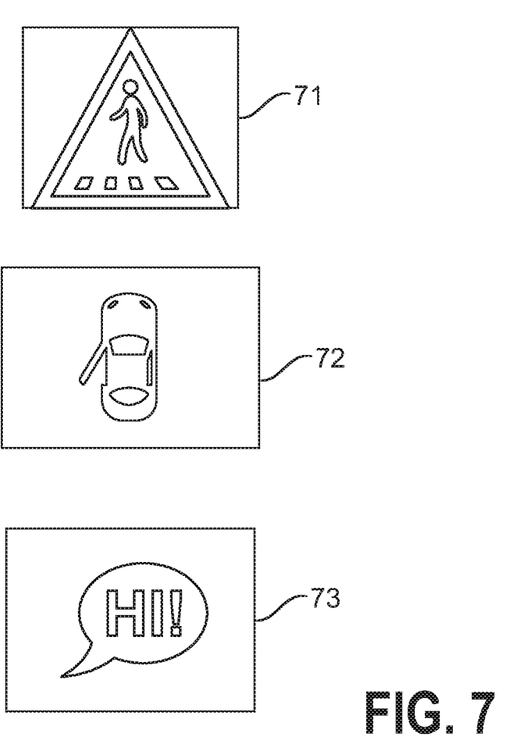
FIG. 7 shows pictograms to be displayed using an embodiment of the passive matrix LED display.

FIG. 7 shows various pictograms that could be displayed using an embodiment of the passive matrix LED display installed at the rear of an automotive vehicle. The uppermost pictogram 71 shows a pedestrian crossing a street and could be displayed in rear unit of a halted autonomous vehicle to indicate the reason why the vehicle has halted. In this example, the autonomous vehicle would have halted after detecting a condition indicating that a pedestrian might step onto the road.

The next pictogram 72 shows an opened side door of a vehicle and could be displayed in rear unit of a halted vehicle to indicate that a passenger will be getting into or out of the vehicle. The driver of the vehicle behind will be alerted to the potential danger.

The next pictogram 73 shows a greeting that might be displayed when an owner approaches her vehicle. Such a message or greeting may also be shown during a journey when the vehicle detects the approach of another vehicle from the rear.

Figure 8:
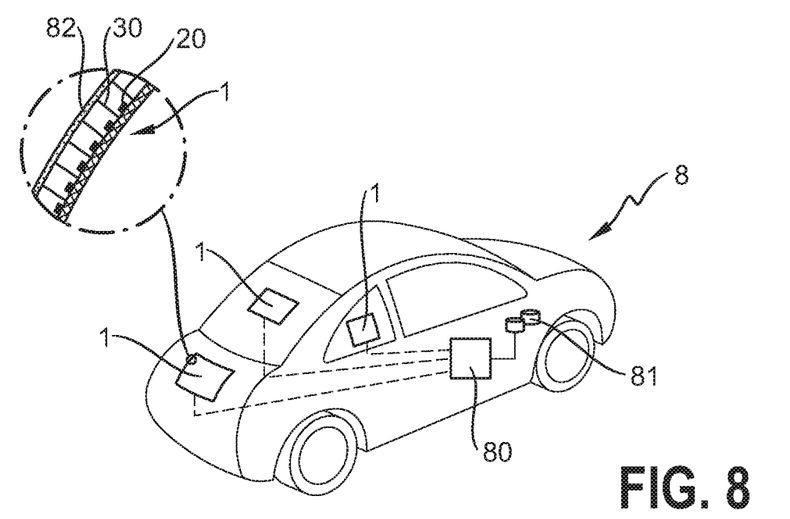
FIG. 8 shows an automotive vehicle equipped with instances of the inventive passive matrix LED display.

FIG. 8 shows an automotive vehicle 8 that has been equipped with various instances of the inventive passive matrix LED display 1. One instance might be installed as a CHMSL (centre high mounted signalling light), another might be installed below the rear window, and another might be installed in a side window. The enlarged portion of the diagram indicates a cross-section through the passive matrix LED display 1 installed below the rear window. In this part of the vehicle 8, the outer layer is realised as a translucent "skin" 82, and the passive matrix LED display 1 is arranged essentially directly underneath the skin 82. The diagram indicates very schematically that a control unit 80 of the vehicle (e.g. an on-board computer) might retrieve image data from a memory module 81 as the need arises (for example to retrieve pictogram 71 above when the vehicle intends to halt to allow a pedestrian to cross), and will issue the necessary commands to the driver of a passive matrix LED display 1 so that the chosen pictogram is displayed.

Figure 9:
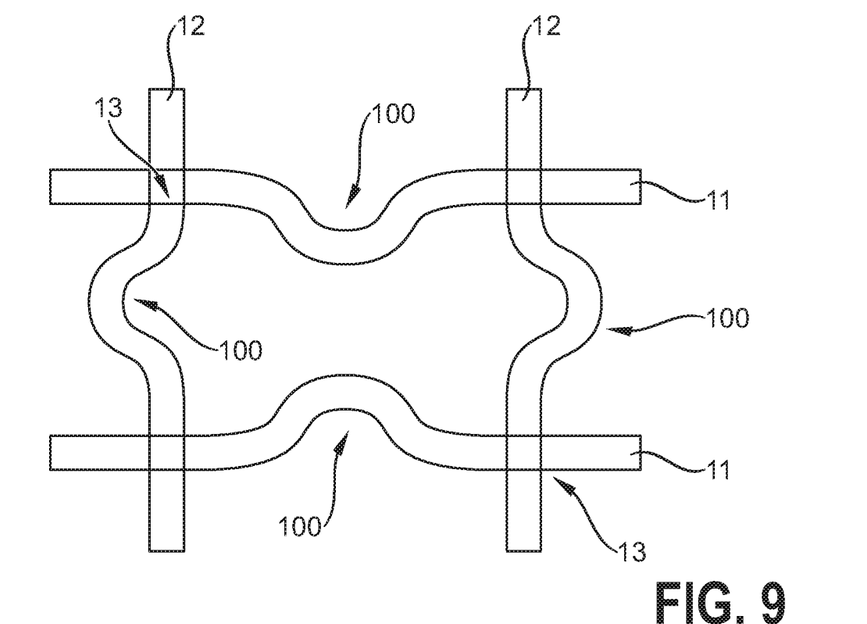
FIG. 9 shows an alternative realisation of a conductor matrix for an embodiment of the inventive passive matrix LED display.

FIG. 9 shows part of an alternative realisation of a conductor matrix 10. Here, the conductor lines 11, 12 are realised as springs, with a deformation 100 between each row/column intersection 13. The assembly of the LED matrix is the same as described in FIGS. 1-6 above. The spring elements 100 between the row/column intersections increase the degree to which the conductor matrix (and therefore also the entire display assembly, since the cavity frame, light-guide material etc. are also flexible and elastic) can be shaped to adapt to a curved mounting surface, as explained above.

Figure 10:
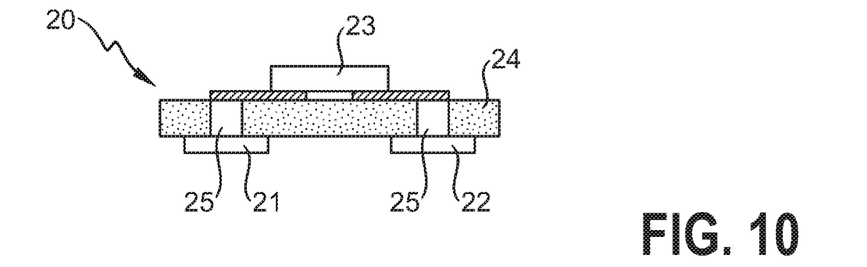
FIG. 10 shows a cross-section through an exemplary LED package.
Figure 11:
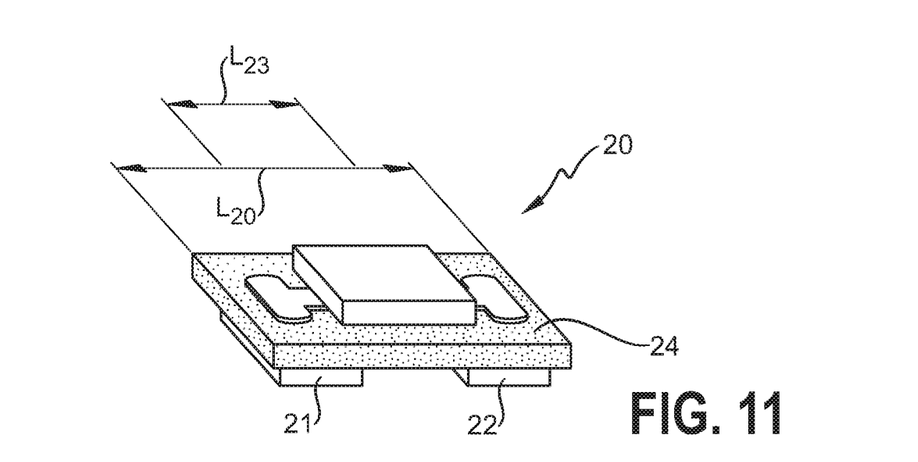
FIG. 11 shows a perspective view of the embodiment of FIG. 10.

FIG. 10 shows a cross-section through an exemplary LED package 20, showing a chip-scale package LED unit 23 mounted on a relatively large interposer 24. The anode and cathode of the CSP LED are soldered to patterned tracks on the interposer 24. Vias 25 formed in the interposer 24 lead to the anode 21 and cathode 22 on the underside of the interposer 24. A perspective view is given in FIG. 11, which also shows exemplary patterned tracks on the interposer 24. The interposer 24 can be a ceramic carrier, a small PCB, etc., any may have dimensions in the order of 5 mm×5 mm. The width $L_{20}$ of the LED package 20 (given by the width of the interposer 24) is preferably significantly larger than the width $L_{23}$ of the CSP LED unit 23, which can be in the order of only 0.7 mm. For example, an LED 23 measuring 0.7 mm×0.7 mm has a surface area of less than 0.5 mm$^2$. This is less than 2% of the interposer area (25 mm$^2$) for an interposer measuring 5.0 mm on each side. Instead of the CSP LED mentioned above, a WLP LED could be used. Equally, the LED could be provided as a miniature assembly in which an LED die is mounted on a small carrier and provided with side-coatings, a light guide, etc.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

REFERENCE SIGNS passive matrix LED display assembly 1
matrix 10
spring element 100
row conductor line 11
column conductor lines 12
recess 120
intersection 13
insulation layer 14
LED package 20
LED package width L20
LED package anode 21
LED package cathode 22
CSP LED unit 23
LED width L23
interposer 24
via 25
cavity frame 30
cavity 31
cavity width L31
light-guide material filler 32
matrix driver 40
memory 50
image data 51
controller 60
pictogram 71, 72, 73
vehicle 8
control unit 80
memory module 81
skin 82

What is claimed is:

1. A passive matrix single-colour light emitting diode (LED) display assembly comprising:
   a matrix of row conductor lines and column conductor lines, the column conductor lines including a spring element arranged between neighboring intersections of the row conductor lines and the column conductor lines;
   a layer of electrically insulating material applied onto a surface of the row conductor line to electrically isolate that row conductor line from any intersecting column conductor lines;
   an array of direct-emitting LED packages, each of the direct-emitting LED packages in the array comprising an LED mounted on an interposer with an anode electrically coupled to one of the row conductor lines and a cathode electrically coupled to one of the column conductor lines enabling individual control of LEDs in the array; and
   a driver configured to apply a row bias voltage to a row conductor line and to apply a column bias voltage to a column conductor line according to an image to be displayed.

2. The passive matrix LED display assembly according to claim 1, wherein the LED comprises at least one of a wafer-level package and a chip-scale package.

3. The passive matrix LED display assembly according to claim 1, wherein the driver is configured to drive the LED packages to display a pictogram.

4. The passive matrix LED display assembly according to claim 1, wherein at least one of the direct-emitting LED packages in the array of direct-emitting LED packages is enclosed by a light-guide element.

5. The passive matrix LED display assembly according to claim 1, comprising a cavity frame arranged over the array of LED packages, which cavity frame is realised to comprise a matrix of cavities, and wherein each cavity is shaped to surround an LED package.

6. The passive matrix LED display assembly according to claim 5, wherein cavities of the cavity frame are filled with a light-guide material.

7. The passive matrix LED display assembly according to claim 1, wherein the conductor lines have a thickness of 0.2 mm to 1.0 mm and a width of approximately 2.5 mm and stamped from a flat metal sheet.

8. The passive matrix LED display assembly according to claim 1, wherein the conductor lines are shaped such that the thickness of an intersection does not exceed the thickness of the thickest conductor line.

9. The passive matrix LED display assembly according to claim 1, wherein the conductor lines are coupled by the LED packages.

10. The passive matrix LED display assembly according to claim 1, wherein the row bias voltage and the column bias voltage are equivalent voltages.

11. An automotive vehicle comprising:
    a plurality of passive matrix single-colour light emitting diode (LED) display assemblies, each display assembly comprising:
    a matrix of row conductor lines and column conductor lines, the column conductor lines including a spring element arranged between neighboring intersections of the row conductor lines and the column conductor lines;
    a layer of electrically insulating material applied onto a surface of a row conductor line to electrically isolate that row conductor line from any intersecting column conductor lines;
    an array of direct-emitting LED packages, each of the direct-emitting LED packages in the array comprising an LED mounted on an interposer with an anode electrically coupled to one of the row conductor lines and a cathode electrically coupled to one of the column conductor lines enabling individual control of LEDs in the array;
    a driver configured to apply a row bias voltage to a row conductor line and to apply a column bias voltage to a column conductor line according to an image to be displayed;
    a memory configured to store image data for a number of images; and
    a controller configured to retrieve image data for a specific image and to control the driver of the passive matrix LED display assembly to display the specific image.

* * * * *